United States Patent
Soeta

(10) Patent No.: US 7,341,476 B2
(45) Date of Patent: Mar. 11, 2008

(54) INTER-MEMBER CONNECTION STRUCTURE, METHOD OF MANUFACTURING THE SAME, AND ELECTRONIC APPARATUS INCLUDING INTER-MEMBER CONNECTION STRUCTURE

(75) Inventor: Kaoru Soeta, Tokyo (JP)

(73) Assignee: Alps Electric Co., Ltd, Tokyo (JP)

( * ) Notice: Subject to any disclaimer, the term of this patent is extended or adjusted under 35 U.S.C. 154(b) by 0 days.

(21) Appl. No.: 11/421,723

(22) Filed: Jun. 1, 2006

(65) Prior Publication Data

US 2006/0286857 A1 Dec. 21, 2006

(30) Foreign Application Priority Data

Jun. 15, 2005 (JP) ............................. 2005-175125

(51) Int. Cl.
*H01R 12/24* (2006.01)
(52) U.S. Cl. ..................................... 439/493
(58) Field of Classification Search ........ 439/492–499, 439/67
See application file for complete search history.

(56) References Cited

U.S. PATENT DOCUMENTS

| | | | | |
|---|---|---|---|---|
| 4,358,173 A | * | 11/1982 | Conrad | 439/71 |
| 4,538,865 A | * | 9/1985 | Wakabayashi et al. | 439/66 |
| 4,639,063 A | * | 1/1987 | Mueller | 439/325 |
| 4,743,080 A | * | 5/1988 | Siraty | 439/492 |
| 4,934,946 A | * | 6/1990 | Ordway | 439/77 |
| 4,948,378 A | * | 8/1990 | Hoshino | 439/271 |
| 4,975,068 A | * | 12/1990 | Squires | 439/67 |
| 5,007,842 A | * | 4/1991 | Deak et al. | 439/66 |
| 5,219,293 A | * | 6/1993 | Imamura | 439/67 |
| 5,263,868 A | * | 11/1993 | Renn et al. | 439/67 |
| 5,482,473 A | * | 1/1996 | Lord et al. | 439/67 |
| 5,730,619 A | * | 3/1998 | Hamlin | 439/493 |
| 5,839,917 A | | 11/1998 | Takahashi et al. | |
| 5,993,247 A | * | 11/1999 | Kidd | 439/495 |
| 6,017,244 A | * | 1/2000 | Daane | 439/495 |
| 6,033,233 A | * | 3/2000 | Haseyama et al. | 439/66 |
| 6,077,090 A | * | 6/2000 | Campbell et al. | 439/67 |
| 6,109,927 A | * | 8/2000 | Scholz et al. | 439/65 |
| 6,164,979 A | * | 12/2000 | Gillette et al. | 439/67 |
| 6,230,397 B1 | * | 5/2001 | Tighe | 29/830 |
| 6,247,951 B1 | * | 6/2001 | Di Liello et al. | 439/329 |

(Continued)

FOREIGN PATENT DOCUMENTS

JP 9-82427 3/1997

(Continued)

*Primary Examiner*—Ross Gushi
(74) *Attorney, Agent, or Firm*—Brinks Hofer Gilson & Lione

(57) ABSTRACT

An inter-member connection structure is provided. The inter-member connection structure has a contact-attached sheet having spiral contactors and a flexible printed circuit having electrode portions thereon that face each other. An elastic member and a fixed member are installed on the contact-attached sheet, and both ends of the fixed member are fixed on the mother board by mounting members. As an elastic force is applied to the spiral contactor from the elastic member, the spiral contactor appropriately comes in contact with the electrode portion, and the contact-attached sheet and the flexible printed circuit can be securely supported on the board. A method of manufacturing an inter-member connection structure is provided.

9 Claims, 12 Drawing Sheets

U.S. PATENT DOCUMENTS

| | | |
|---|---|---|
| 6,299,469 B1 * | 10/2001 | Glovatsky et al. ........... 439/329 |
| 6,425,768 B1 * | 7/2002 | Taylor ......................... 439/67 |
| 6,517,362 B2 | 2/2003 | Hirai et al. |
| 6,551,112 B1 * | 4/2003 | Li et al. ........................ 439/66 |
| 6,592,380 B2 | 7/2003 | Miyazawa et al. |
| 6,627,092 B2 * | 9/2003 | Clements et al. .............. 216/13 |
| 6,634,890 B2 * | 10/2003 | Peterson et al. .............. 439/67 |
| 6,722,893 B2 * | 4/2004 | Li et al. ........................ 439/66 |
| 6,753,477 B1 * | 6/2004 | Sinkunas et al. ......  174/117 FF |
| 6,960,094 B2 * | 11/2005 | Tomonari et al. ........... 439/329 |
| 7,033,208 B1 * | 4/2006 | Huang et al. ................ 439/498 |
| 2003/0022532 A1 * | 1/2003 | Clements et al. .............. 439/66 |
| 2006/0046533 A1 * | 3/2006 | Okamoto et al. ............. 439/74 |

FOREIGN PATENT DOCUMENTS

| | | |
|---|---|---|
| JP | 2001-313109 | 11/2001 |

* cited by examiner

INTER-MEMBER CONNECTION STRUCTURE, METHOD OF MANUFACTURING THE SAME, AND ELECTRONIC APPARATUS INCLUDING INTER-MEMBER CONNECTION STRUCTURE

BACKGROUND

1. Field

An inter-member connection structure that is used for electronic apparatuses is described.

2. Related Art

Generally, when an FPC cable extending from a hard disc drive (HDD) is connected to a predetermined electrode portion on a mother board, a connector is provided at a front end of the FPC cable. In the meantime, a connecting block having an insertion hole is provided on the mother board. As the connector is inserted into the insertion hole, the hard disc drive (HDD) and the mother board are electrically connected to each other.

For example, lock claws are formed on the connector, and the insertion hole has a concave portion for locking. When the connector is inserted into the insertion hole, the lock claws are locked into the concave portion for locking. As a result, the connector is fixed into the insertion hole.

An inter-member connection structure making use of the connectors in the related art is disclosed in JP-A-2001-313109 (for example, refer to FIG. 6) or in JP-A-9-82427.

However, it is hard to appropriately promote size reduction of the inter-member connection structure in the configuration disclosed in JP-A-2001-313109 or in JP-A-9-82427. That is, the inter-member connection structure is likely to be large-sized due to the connector and the connecting block including the insertion hole into which the connector is inserted. Therefore, the inter-member connection structures shown in JP-A-2001-313109 or in JP-A-9-82427 have not been able to be used for small electronic apparatuses, such as cellular phones. In addition, the inter-member connection structure using the connector may be complicated.

In addition, relatively high contact pressure tends to be applied when the connector is inserted into the insertion hole. Also, it is difficult to supply constant contact pressure to all the electronic portions inside the inter-member connection structure.

SUMMARY

Provided is an inter-member connection structure that can be simplified and reduced in size, a method of manufacturing the same, and an electronic apparatus including the inter-member connection structure.

According to a first aspect, an inter-member connection structure includes a first member that has electrode portions formed thereon and a contact member that has contacts formed on a surface of the contact member facing the electrode portions. Further, the elastic force is applied to the contacts of the contact member in a first member direction, and the contacts and the electrode portions are connected to each other.

In the inter-member connection structure according to the first aspect, the contacts and the electrode portions can be connected to each other by using an electric force in a first member direction, so that the connection structure can be simplified and reduced in size.

In the inter-member connection structure according to the first aspect, it is preferable that a fixed member be installed on an opposite surface of the surface of the contact member facing the electrode portions and have both ends supported on the first member or another member different from the first member and the contact member. Therefore, the contact member and the first member can be securely supported. In addition, since the contact member can be easily separated from the first member, it is easy to replace the contact member for a new contact member. Further, it is preferable that both ends of the fixed member be fixed into the first member or another member different from the first member and the contact member. Therefore, the contact member and the first member can be securely and easily supported.

In the inter-member connection structure according to the first aspect, it is preferable that the fixed member come into contact with at least a portion of the opposite surface of the surface of the contact member facing the electrode portions, and the contacts be pressurized on the electrode portions when the elastic force is received from the fixed member in the first member direction. The connection structure can be formed to be small-sized by laminating the first member, the contact member and the fixed member on one another. In addition, with the simplified configuration, the elastic force in the first member direction can be applied to the contact, so that a secure electrical connection can be achieved between the contact and the electrode portion.

In the inter-member connection structure according to the first aspect, it is preferable that an elastic member be installed between the contact member and the fixed member, and the contacts be pressurized on the electrode portions when the elastic force is received from the elastic member in the first member direction. Therefore, a secure electrical connection can be achieved between the contact and the electrode portion.

In the inter-member connection structure according to the first aspect, it is preferable that an elastic arm extending in the first member direction be installed in the contact, and the contact be pressurized on the electrode portion by the elastic force of the elastic arm in the first member direction. Therefore, with the simplified structure, a secure electrical connection can be achieved between the contact and the electrode portion.

According to a second aspect, an inter-member connection structure includes a first member that has electrode portions formed thereon and a contact member that has contacts formed on a surface facing the electrode portions. Further, elastic arms extending in a first member direction are installed in the contacts, the elastic arms are connected to the electrode portions, and the first member and the contact member are adhesively fixed to each other.

In the inter-member connection structure according to the second aspect, since the elastic arm is installed in the contact and connected to the electrode portion, a secure electrical connection between the contact and the electrode portion can be achieved. In addition, the first member and the contact member can be securely fixed to each other, so that they are surely supported with a small-sized structure.

In the inter-member connection structure according to the second aspect, it is preferable that the elastic arm be formed so as to extend in a spiral shape from a base end to a front end.

The inter-member connection structure according to the second aspect further includes a second member that has electrode portions formed thereon. The contact member includes first contacts connected to the electrode portions of the first member and second contacts connected to the electrode portions of the second member, and the first contacts and the second contacts are opposite to each other and connected to each other by conductive patterns.

In the inter-member connection structure according to the second aspect, the first member and/or the second member is a flexible printed circuit board.

According to a third aspect, a method of manufacturing an inter-member connection structure includes forming contacts on a sheet with a sacrificial layer interposed therebetween, each of the contacts having a mounting portion and an elastic arm, different internal stresses being applied to top and bottom surfaces of the contacts, the sacrificial layer being not interposed at least between the mounting portion and the elastic arm; making the contacts face electrode portions of a first member, the first member having the electrode portions formed thereon; interposing an adhesive between the contact member and the first member; and bending the elastic arm in a direction of the electrode portion by means of a heat treatment so as to connect the elastic arm to the electrode portion.

In the method of manufacturing an inter-member connection structure according to the third aspect, the contact and the electrode portion can be reliably electrically connected to each other, and the first member and the contact member can be reliably adhered to each other with a small-sized structure.

In the method of manufacturing an inter-member connection structure according to the third aspect, it is preferable that the adhesive be hardened by means of the heat treatment by using a thermosetting adhesive as the adhesive. By means of the heat treatment, both a process for bending the elastic arm in a direction of the electrode portion and a process for hardening the adhesive can be performed at the same time.

According to a fourth aspect, an electronic apparatus includes the above-described inter-member connection structure. By reducing the size of the connection structure, the electronic apparatus can also be reduced in size.

DESCRIPTION OF THE PREFERRED EMBODIMENTS

Figure 1:
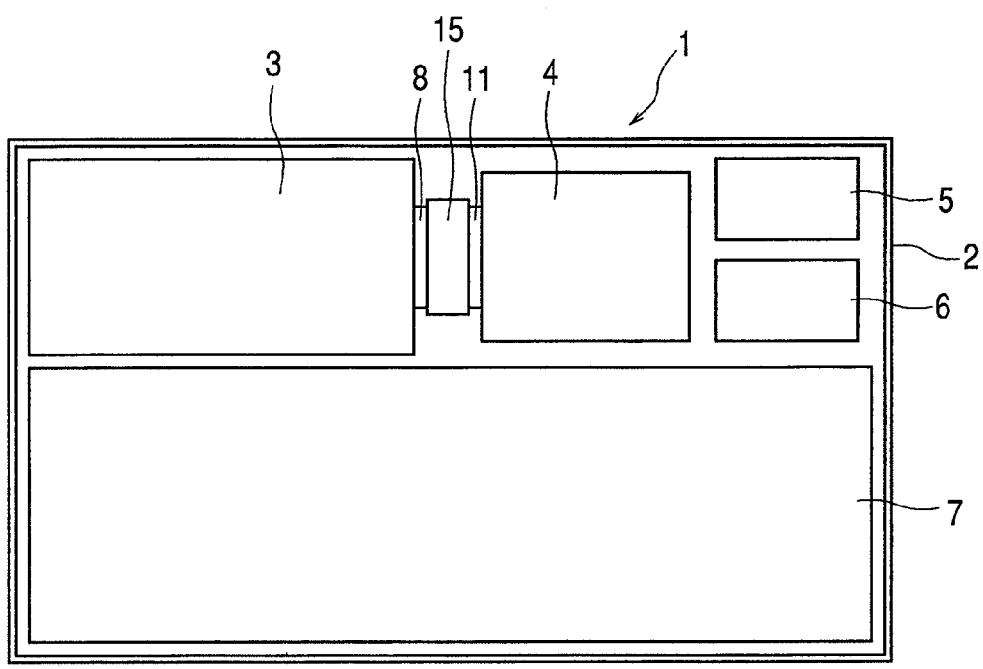
FIG. 1 is a partial plane view illustrating an internal structure of a notebook-type personal computer.
Figure 1:
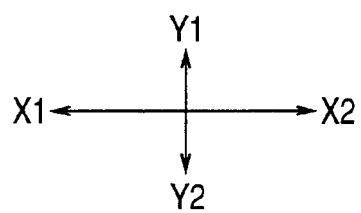
Figure 2:
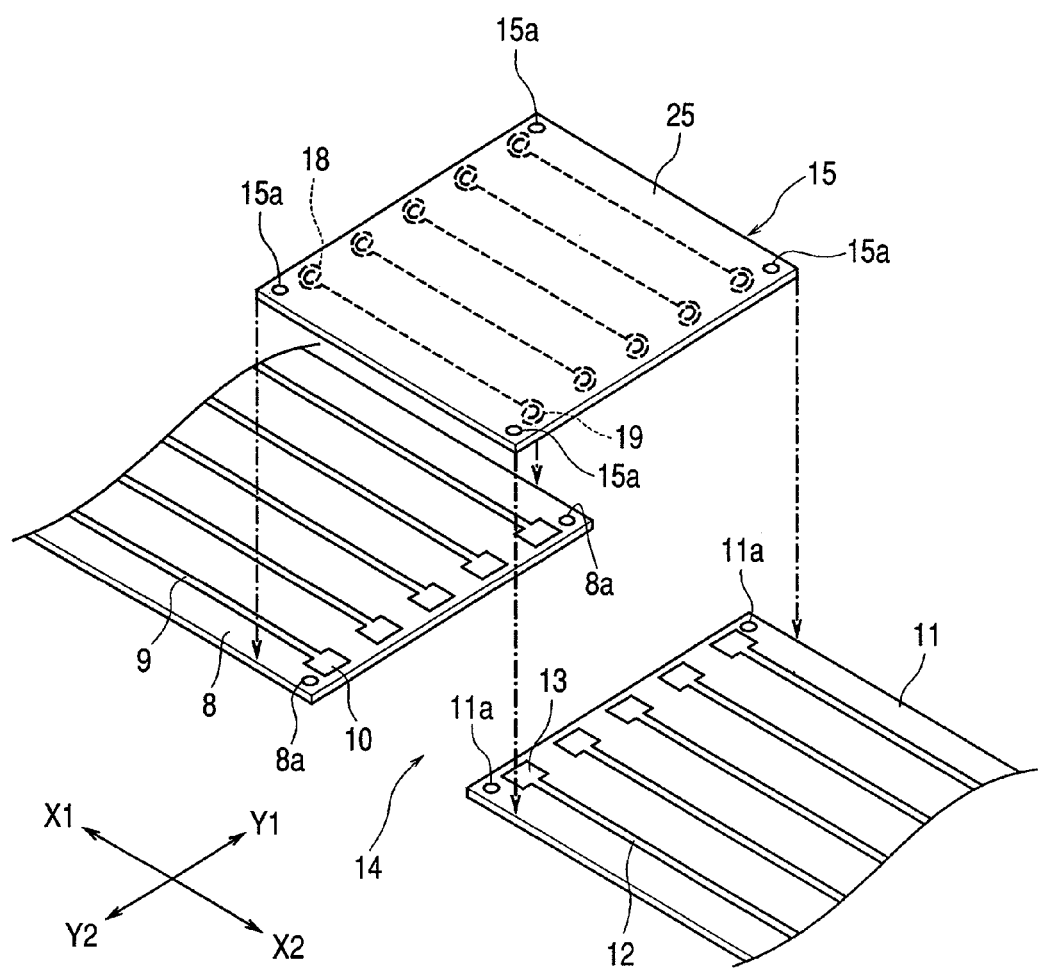
FIG. 2 is a partial exploded perspective view illustrating an inter-member connection structure between a hard disc drive (HDD) and a central processing unit (CPU)
Figure 3:
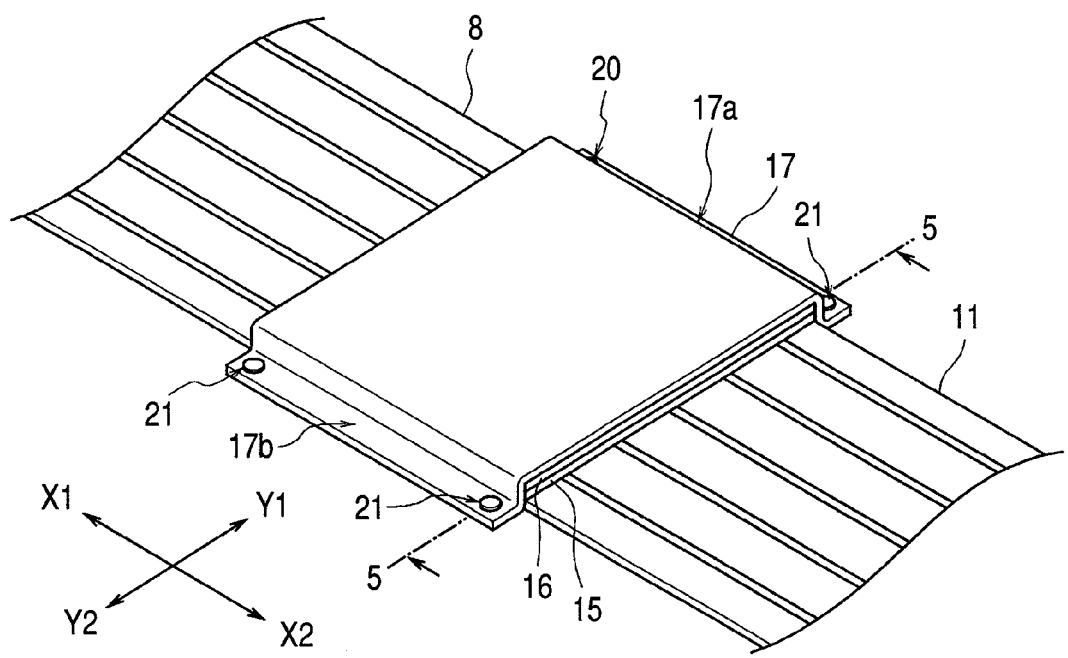
FIG. 3 is a view (partial perspective view) illustrating a completed state of the inter-member connection structure shown in FIG. 2.
Figure 4:
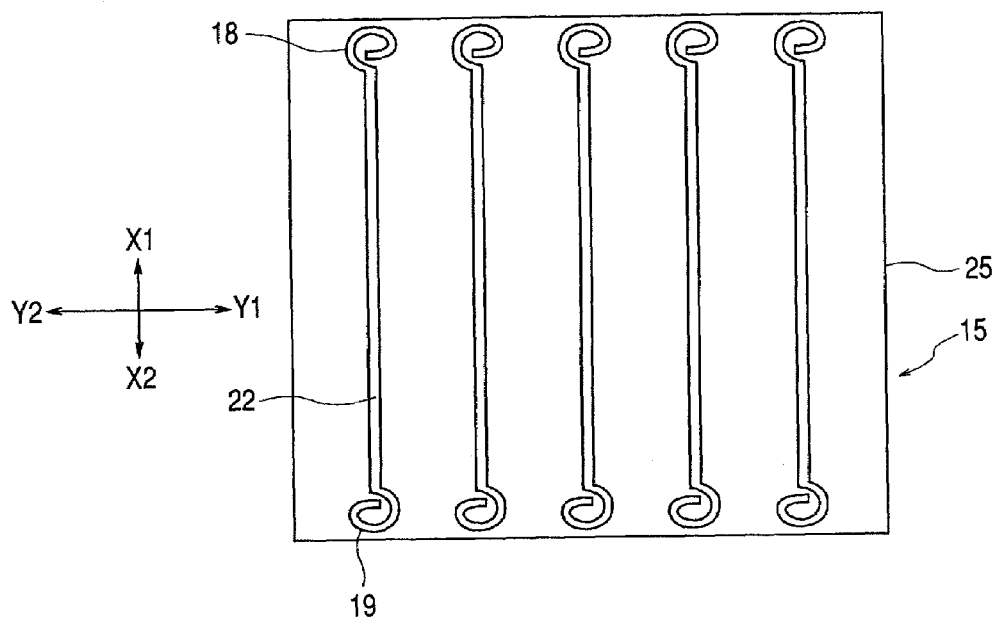
FIG. 4 is a view illustrating a rear surface of a contact-attached sheet.
Figure 5:
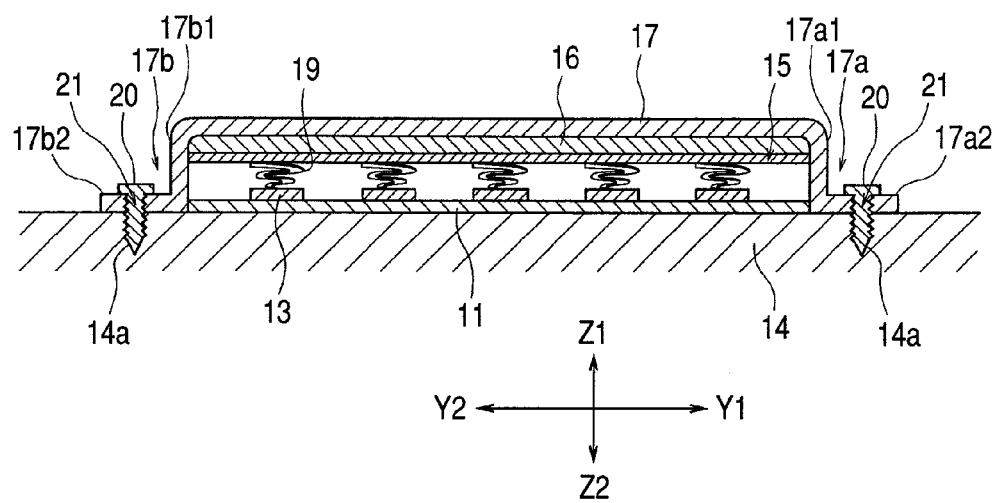
FIG. 5 is a partial cross-sectional view taken along the line V-V of FIG. 3, which illustrates the inter-member connection structure viewed in an arrow direction.
Figure 6:
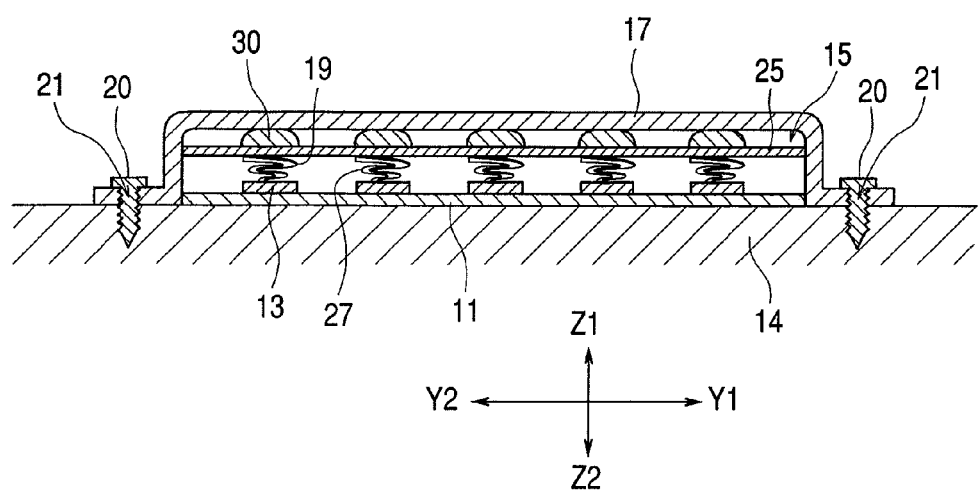
FIG. 6 is a partial cross-sectional view illustrating an inter-member connection structure different from that in FIG. 5.
Figure 7:
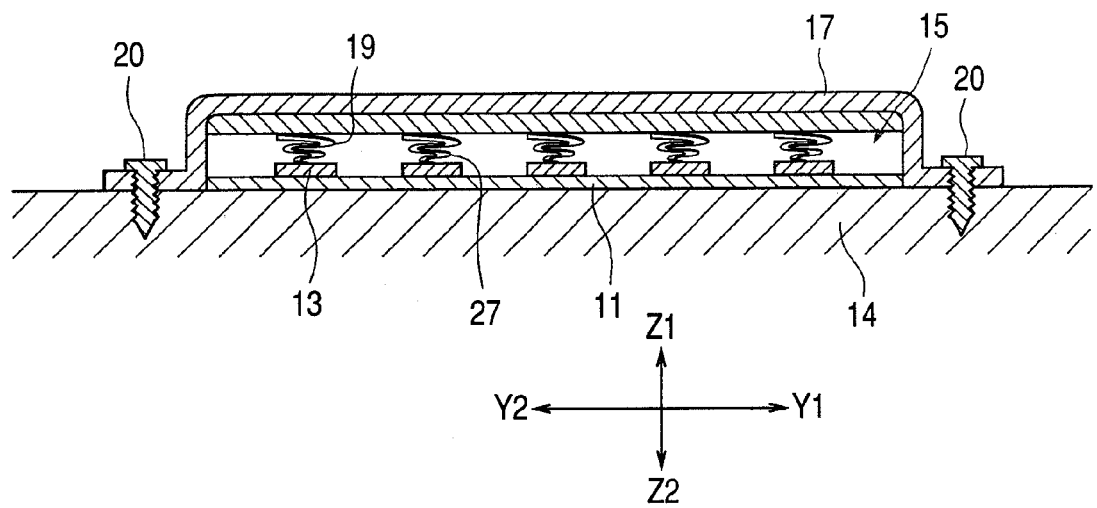
FIG. 7 is a partial cross-sectional view illustrating an inter-member connection structure different from the connection structures in FIGS. 5 and 6.
Figure 8:
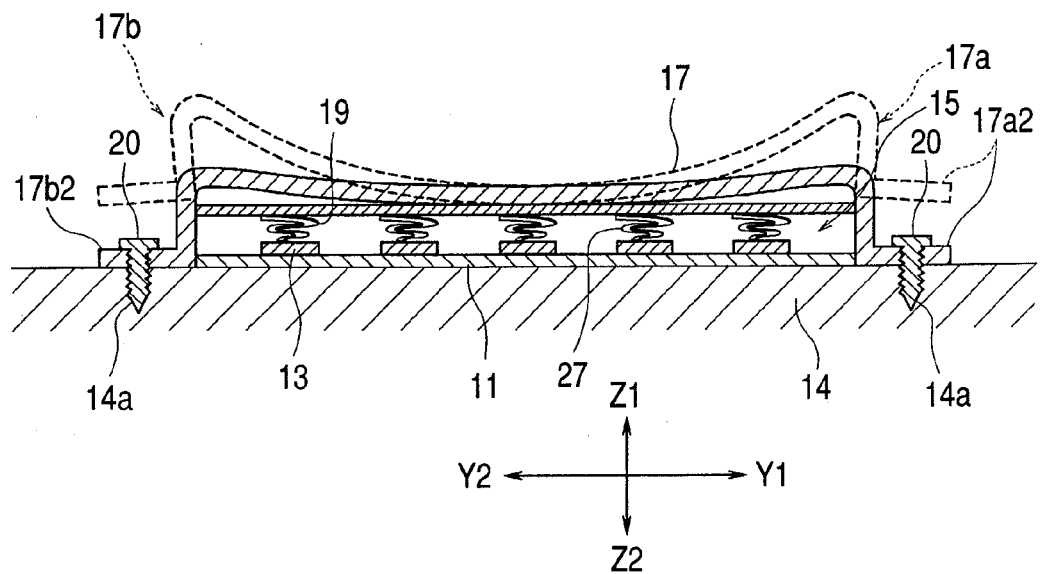
FIG. 8 is a partial cross-sectional view illustrating an inter-member connection structure different from the connection structures in FIG. 5 to 7.
Figure 9:
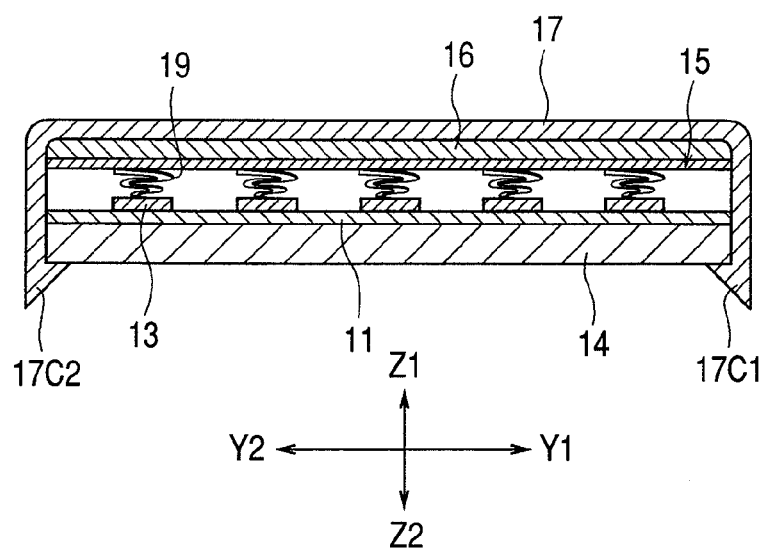
FIG. 9 is a partial cross-sectional view illustrating an inter-member connection structure different from the connection structures in FIGS. 5 to 8.
Figure 10:
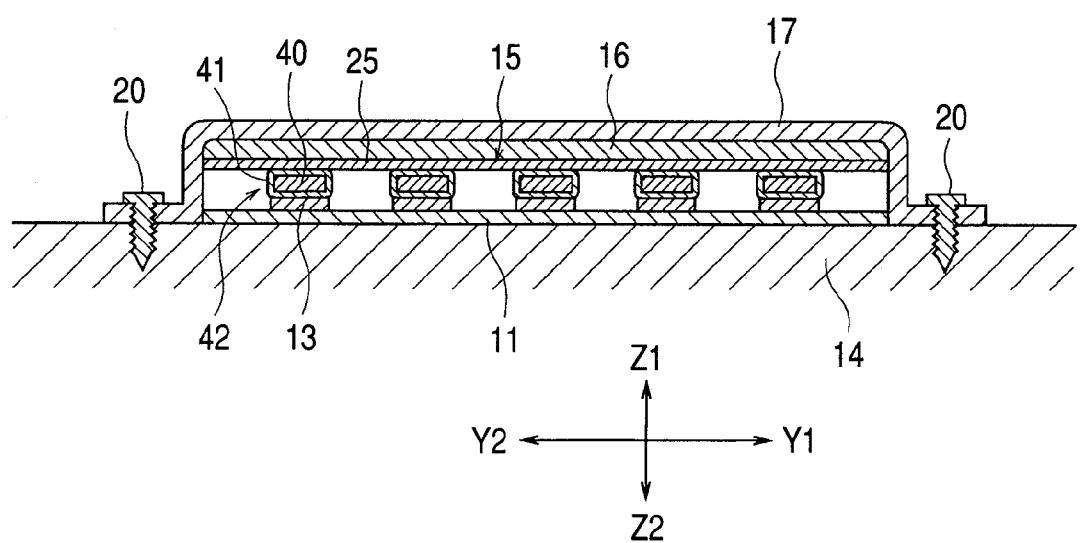
FIG. 10 is a partial cross-sectional view illustrating an inter-member connection structure different from the connection structures in FIGS. 5 to 9.
Figure 11:
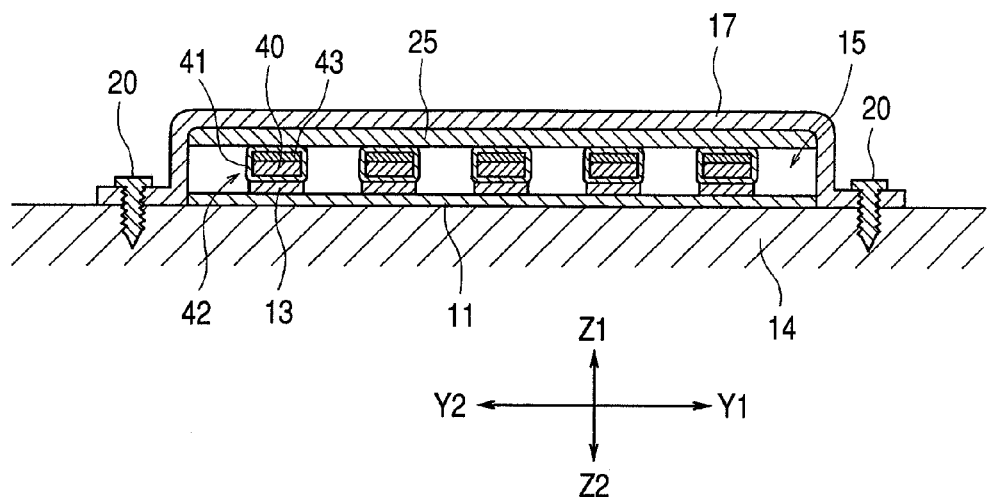
FIG. 11 is a partial cross-sectional view illustrating an inter-member connection structure different from the connection structures in FIGS. 5 to 10.
Figure 12:
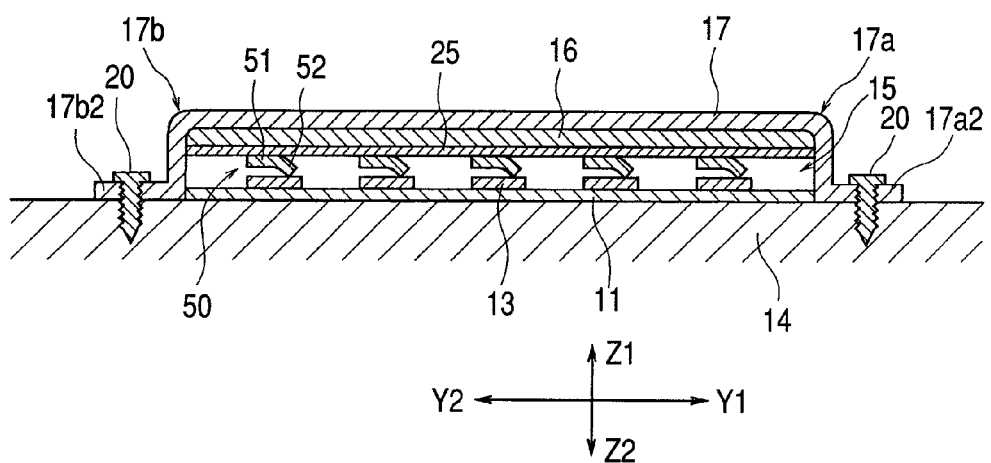
FIG. 12 is a partial cross-sectional view illustrating an inter-member connection structure different from the connection structures in FIGS. 5 to 11.
Figure 13:
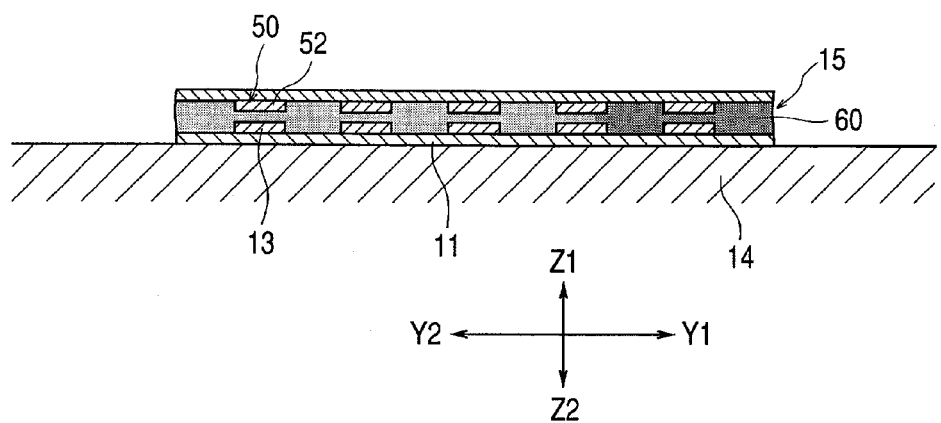
FIG. 13 is a partial cross-sectional view illustrating an inter-member connection structure different from the connection structures in FIGS. 5 to 12, which illustrates a state before contacts come in contact with electrode portions.
Figure 14:
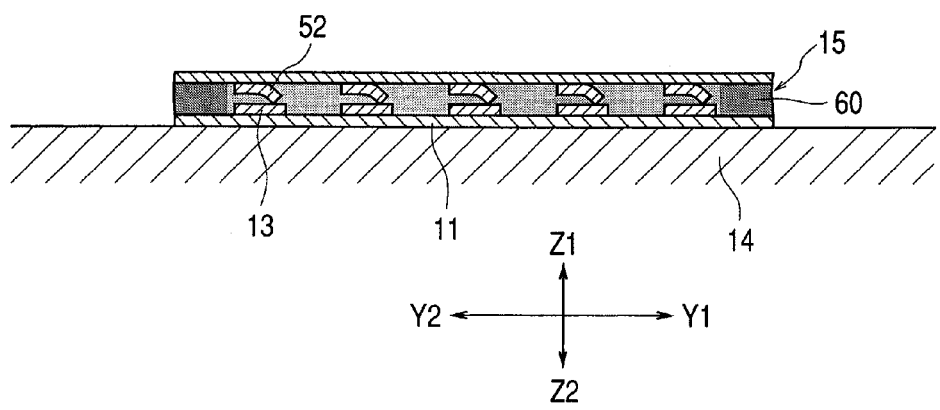
FIG. 14 is a partial cross-sectional view illustrating the inter-member connection structure, which illustrates a state in which the contacts and the electrode portions are connected to each other in FIG. 13.
Figure 15:
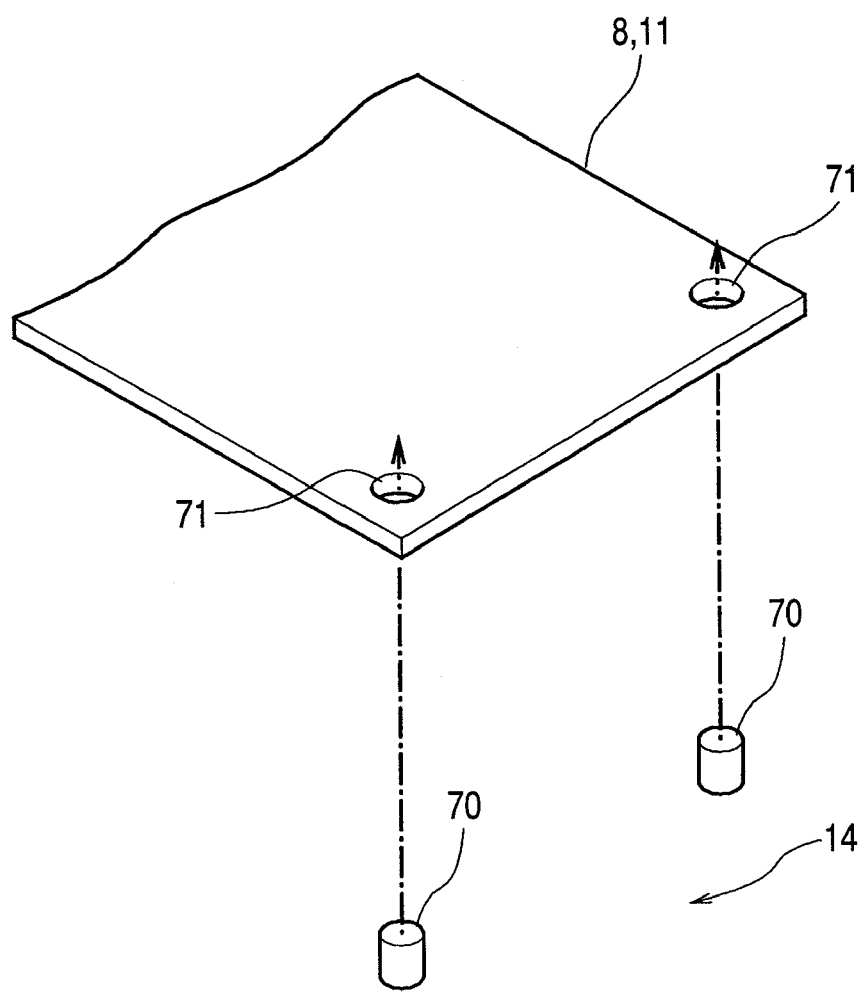
FIG. 15 is a partial exploded perspective view illustrating the inter-member connection structure, which illustrates a structure for determining positions of flexible printed circuit boards with respect to the mother board.
Figure 16:
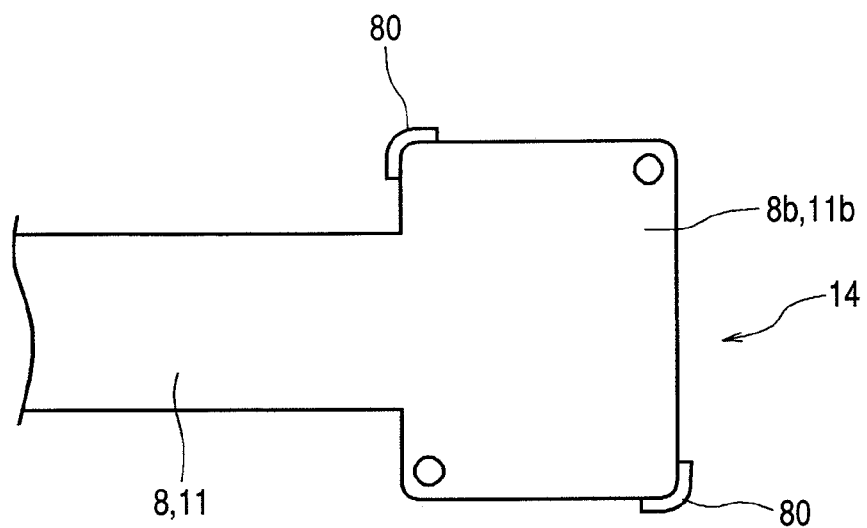
FIG. 16 is a partial plane view illustrating the inter-member connection structure, which illustrates a structure for determining positions of flexible printed circuit boards with respect to the mother board.
Figure 17:
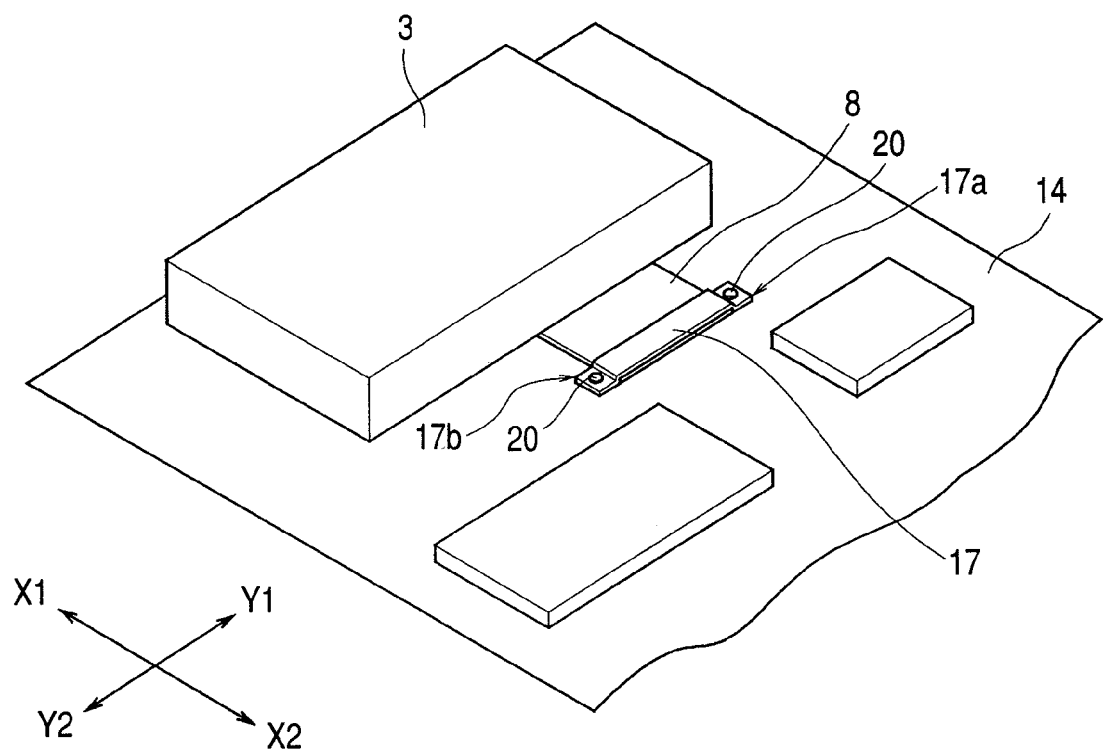
FIG. 17 is a partial perspective view of an electronic apparatus, which illustrates an inter-member connection structure different from that in FIG. 3.
Figure 18:
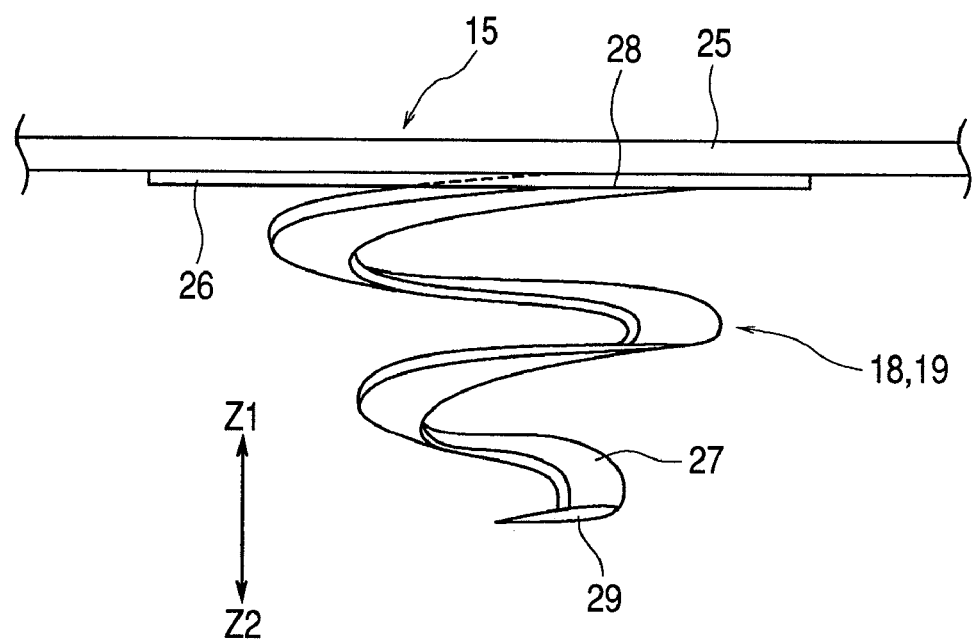
FIG. 18 is a partial side view illustrating spiral contactors.

FIG. 1 is a partial plane view illustrating an internal structure of a notebook-type personal computer. FIG. 2 is a partial exploded perspective view illustrating an inter-member connection structure between a hard disc drive (HDD) and a central processing unit (CPU). FIG. 3 is a view (partial perspective view) illustrating a completed state of the inter-member connection structure shown in FIG. 2. FIG. 4 is a view illustrating a rear surface of a contact-attached sheet. FIG. 5 is a partial cross-sectional view taken along the line V-V of FIG. 3, which illustrates the inter-member connection structure viewed in an arrow direction. FIG. 6 is a partial cross-sectional view illustrating an inter-member connection structure different from that in FIG. 5. FIG. 7 is a partial cross-sectional view illustrating an inter-member connection structure different from the connection structures in FIGS. 5 and 6. FIG. 8 is a partial cross-sectional view illustrating an inter-member connection structure different from the connection structures in FIG. 5 to 7. FIG. 9 is a partial cross-sectional view illustrating an inter-member connection structure different from the connection structures in FIGS. 5 to 8. FIG. 10 is a partial cross-sectional view illustrating an inter-member connection structure different from the connection structures in FIGS. 5 to 9. FIG. 11 is a partial cross-sectional view illustrating an inter-member connection structure different from the connection structures in FIGS. 5 to 10. FIG. 12 is a partial cross-sectional view illustrating an inter-member connection structure different from the connection structures in FIGS. 5 to 11. FIG. 13 is a partial cross-sectional view illustrating an inter-member connection structure different from the connection structures in FIGS. 5 to 12, which illustrates a state before contacts come in contact with electrode portions. FIG. 14 is a partial cross-sectional view illustrating the inter-member connection structure, which illustrates a state in which the contacts and the electrode portions are connected to each other in FIG. 13. FIG. 15 is a partial exploded perspective view illustrating the inter-member connection structure, which illustrates a structure for determining positions of flexible printed circuit boards with respect to the mother board. FIG. 16 is a partial plane view illustrating the inter-member connection structure, which illustrates a structure for determining positions of flexible printed circuit boards with respect to the mother board. FIG. 17 is a partial perspective view of an electronic apparatus, which illustrates an inter-member connection structure different from that in FIG. 3. FIG. 18 is a partial side view illustrating spiral contactors.

In addition, an X1-X2 direction refers to a widthwise direction, a Y1-Y2 direction refers to a lengthwise direction, and a Z1-Z2 direction refers to a heightwise direction. Among the three directions, one direction is orthogonal to the other directions.

As shown in FIG. 1, a plurality of semiconductor devices (electronic components) are installed in a casing 2 of a personal computer (an electronic apparatus) 1, such as a note book. Reference numeral 3 denotes a hard disc drive (HDD) and reference numeral 4 denotes a central processing unit (CPU). Reference numerals 5 and 6 denote memories, and reference numeral 7 denotes a battery.

Though not illustrated in the drawing, a hard disc or a thin film magnetic head is installed in the hard disc drive 3. A first flexible printed circuit board (a first member) 8 extends from one side of the hard disc drive 3 in the widthwise direction (X1-X2 direction). As seen in FIG. 2, a plurality of conductive patterns 9 are formed on a surface of the first flexible printed circuit board 8. An electrode portion 10, which is greater in size than the conductive pattern 9, is formed at a front end of each of the conductive patterns 9. A top surface of the conductive pattern 9 is covered with insulating resist or the like, while the top surface of the electrode portion 10 is exposed. The conductive patterns 9 correspond to signal lines, power lines or the like.

As shown in FIG. 1, a second flexible printed circuit board (a second member) 11 extends from one side of the CPU 4 in the widthwise direction (X1-X2 direction). A plurality of conductive patterns 12 are formed on a surface of the second flexible printed circuit board 11. An electrode portion 13 greater in size than the conductive pattern 12 is formed at a front end of each of the conductive patterns 12 (refer to FIG. 2). A top surface of the conductive pattern 12 is covered with insulating resist or the like, while that of the electrode portion 13 is exposed. The same number of electrode portions 10 and 13 are formed on the first and second printed circuit boards 8 and 11, respectively.

As shown in FIG. 2, the first flexible printed circuit board 8 and the second flexible printed circuit board 11 are disposed on the mother board so as to be opposite to each other at a predetermined interval in a widthwise direction (X1-X2 direction), such that both of the electrode portions 10 and 13 face each other.

Reference numeral 15 shown in FIG. 2 denotes a contact-attached sheet (a contact member). The contact-attached sheet 15 is configured to have an insulating sheet 25, conductive portions (conductive patterns) 22 that are formed on a rear surface of the insulating sheet 25, and spiral contactors 18 and 19.

As shown in FIG. 4, the conductive portions 22, each of which linearly extends in the widthwise direction (X1-X2 direction), are formed on the rear surface of the sheet 25 at predetermined intervals in the lengthwise direction (Y1-Y2 direction). The spiral contactors 18 and 19 are formed at both ends of each conductive portion 22, respectively. The first spiral contactors 18 are formed as many as the electrode portions 10 on the first flexible printed circuit board 8 and located to face the electrode portions 10 in a heightwise direction (Z1-Z2 direction). In addition, the second spiral contactors 19 are formed as many as the electrode portions 13 of the second flexible printed circuit boards 11 and located to face the electrode portions 13 in the heightwise direction (Z1-Z2 direction).

As shown in FIG. 2, positioning holes 15*a*, each of which has a circular shape, are individually formed at four corners of the contact-attached sheet 15. In addition, positioning holes 8*a* and 11*a* are formed on the first flexible printed circuit board 8 and the second flexible circuit board 11, respectively, which are opposite to the positioning holes 15*a* in the heightwise direction (Z1-Z2 direction). For example, either the positioning holes 15*a* or the positioning holes 8*a* and 11*a* are formed as positioning protrusions. In this case, the positioning protrusions are inserted into the positioning holes. As a result, the flexible printed circuit boards 8 and 11 and the contact-attached sheet 15 can be individually positioned.

As shown in a direction indicated by an arrow in FIG. 2, the contact-attached sheet 15 is positioned and disposed on the first flexible printed circuit board 8 and the second flexible printed circuit board 11 by the positioning holes 15*a*, 8*a* and 11*a*. An elastic member 16 is installed on the contact-attached sheet 15, and a fixed member 17 is installed on the elastic member 16 (refer to FIG. 3).

The elastic member 16 is made of, for example, rubber, elastomer, or the like. The elastic member 16 has almost the same size in a plane shape as the contact-attached sheet 15. The elastic member 16 may be attached to a ceiling surface of the fixed member 17 by an adhesive or to the contact-attached sheet 15 by the adhesive. In addition, the elastic member 16 may be attached to neither the fixed member 17 nor the contact-attached sheet 15.

As shown in FIG. 5, both end parts 17*a* and 17*b* of the fixed member 17 in the lengthwise direction (Y1-Y2 direction) include lateral portions 17*a*1 and 17*b*1 extending in a downward direction (Z2 direction), and mounting portions 17*a*2 and 17*b*2, which are in contact with the mother board 14 and extend in a direction where the mounting portions 17*a*2 and 17*b*2 are separated from the contact-attached sheet 15. The lateral portions 17*a*1 and 17*b*1 are integrally formed with the mounting portions 17*a*2 and 17*b*2. As shown in FIG. 5, one end part 17*a* forms a substantially 'L' shape and the other end part 17*b* forms a substantially reverse 'L' shape.

As shown in FIGS. 3 and 5, two through holes 21 are respectively formed on the mounting portions 17*a*2 and 17*b*2 of both end parts 17*a* and 17*b* of the fixed member 17 in the widthwise direction (X1-X2 direction). As shown in FIG. 5, insertion concave portions 14*a* are formed on the mother board 14 opposite to the through holes 21. A mounting member 20, such as a screw, is inserted into the through hole 21 and the insertion concave portion 14*a*. As a result, the fixed member 17 is reliably fixed on the mother board 14. Accordingly, the first flexible printed circuit board 8, the second flexible printed circuit board 11, the contact-attached sheet 15, and the elastic member 16, which are interposed between the fixed member 17 and the mother board 14, are securely supported on the mother board 14. The fixed member 17 and the mother board 14 may be fixed to each other by using a clip or the like, which is more likely to increase the size of the structure. For size reduction of the inter-member connection structure, it is preferable that the fixed member 17 be fixed on the mother board 14 by the mounting member 20 such as a screw, as shown in FIG. 5.

If enlarged, the spiral contactors 18 and 19 formed on the rear surface of the contact-attached sheet 15 have a lateral shape shown in FIG. 18.

In the spiral contactors 18 and 19, a mounting portion 26 that has a predetermined thickness and a plane shape is integrally formed with an elastic arm 27 that extends from the mounting portion 26. The elastic arm 27 is formed in a three-dimensional spiral shape from a base end 28 in contact with the interface with the mounting portion 26 down to the front end 29. The front end 29 is located almost at the center of the spiral pattern.

The spiral contactors 18 and 19 are formed by an etching method or a plating method. According to the etching method, a thin-plate shaped copper film is etched to form the same shape as a spiral contactor. In addition, a surface of the etched copper film is plated with nickel or nickel-phosphorus for reinforcement. Alternatively, the spiral contactors 18 and 19 may be formed of a laminator of copper and nickel or another laminator of copper and nickel-phosphorus. This structure generally works in such a manner that nickel or nickel-phosphorus carries out its elastic function and copper lowers specific resistance.

Further, the spiral contactors 18 and 19 can be formed by plating a copper layer, or can be formed by laminating copper or nickel according to continuous plating to form a layer or by laminating copper and nickel-phosphorous according to continuous plating to form a layer.

It is preferable that the conductive portions 22 be formed simultaneously with the spiral contactors 18 and 19.

As shown in FIG. 5, in a state in which the elastic member 16 is compressed to the thickness slightly less than one when no force is applied, it is interposed between the fixed member 17 and the contact-attached sheet 15. Accordingly, the elastic member 16 generates an elastic force (referred to as elastic repulsive force) in the vertical direction (Z1-Z2 direction) so as to return to its original shape. As a result, the elastic force of the elastic member 16 itself, which acts in the downward direction in the drawing, is applied to the spiral contactors 18 and 19 of the contact-attached sheet 15. In addition, in a state in which the elastic arms 27 formed on the spiral contactors 18 and 19 are compressed to the thickness slightly less than one when no force is applied, they are interposed between the elastic member 16 and the flexible printed circuit boards 8 and 11. Accordingly, the elastic arms 27 also generate an elastic force in the vertical direction (Z1-Z2 direction) so as to return to their original shapes. Due to this, the elastic force of the elastic arm 27 itself, which acts in the downward direction in the drawing, is applied to the spiral contactors 18 and 19 of the contact-attached sheet 15. As a result, the elastic arms 27 of the spiral contactors 18 and 19 are appropriately pushed onto the electrode portions 10 and 13 of the flexible printed circuit boards 8 and 11, and the elastic arms 27 and the electrode portions 10 and 13 are securely electrically connected to each other. Accordingly, the electrode portion 10 of the first flexible printed circuit board 8 and the electrode portion 13 of the second flexible printed circuit board 11 are electrically connected to each other by the spiral contactors 18 and 19 and the conductive portions 22 of the contact-attached sheet 15.

According to the present embodiment, a simple structure, in which the contact-attached sheet 15, the elastic member 16, and the fixed member 17 are laminated on the flexible printed circuit boards 8 and 11 so as to overlap one another and the fixed member 17 is supported on the mother board 14, can securely support the flexible printed circuit boards 8 and 11 and the contact-attached sheet 15, and maintain superior electrical connection. In addition, the inter-member connection structure can be made to be small-sized. The inter-member connection structure shown in FIG. 3 can be easily formed at a small gap between the hard disc drive 3 and the CPU 4. In addition, according to the present embodiment, the contact-attached sheet 15 can be easily replaced with a new contact-attached sheet 15 by separating the mounting member 20. That is, a convenient way of replacing the contact-attached sheet can be provided. In addition, since connection under small loads is allowed, it is easy to make contact pressure constant between the electrode portions 10 and 13 and the spiral contactors 18 and 19.

According to an embodiment shown in FIG. 6, elastic members 30, each of which is made of rubber, elastomer, or the like, are partially installed at locations of a top surface of the sheet 25 of the contact-attached sheet 15 that faces the spiral contactors 18 and 19 in the heightwise direction (Z1-Z2 direction). It is preferable that the elastic member 30 be attached to the top surface of the sheet 25 by means of an adhesive or the like. By attaching the elastic member 30 not to the fixed member 17 but to the sheet 25, the respective elastic members 30 and the spiral contactors 18 and 19 can appropriately or simply face each other in the heightwise direction (Z1-Z2 direction).

In the embodiment shown in FIG. 6, like in FIG. 5, in a state in which the elastic member 30 is compressed to a thickness slightly less than one when no force is applied, it is interposed between the fixed member 17 and the contact-attached sheet 15.

Accordingly, the elastic member 30 generates an elastic force in the vertical direction (Z1-Z2 direction) so as to return to its original shape, and the elastic force is applied to the spiral contactors 18 and 19 of the contact-attached sheet 15 in the downward direction in the drawing. In addition, in a state in which the elastic arms 27, which are formed on the spiral contactors 18 and 19, are compressed to a thickness slightly less than one when no force is applied, they are interposed between the elastic member 30 and the flexible printed circuit boards 8 and 11.

Accordingly, the elastic arms 27 generate an elastic force in the vertical direction (Z1-Z2 direction) so as to return to their original shapes, and the elastic forces of the elastic arms 27, which act in the downward direction in the drawing, are applied to the spiral contactors 18 and 19. As a result, the elastic arms 27 of the spiral contactors 18 and 19 are reliably pushed onto the electrode portions 10 and 13 of the flexible printed circuit boards 8 and 11, and the elastic arms 27 and the electrode portions 10 and 13 are reliably electrically connected to each other.

Accordingly, the electrode portion 10 of the first flexible printed circuit board 8 and the electrode portion 13 of the second flexible printed circuit board 11 are electrically connected to each other by the spiral contactors 18 and 19 and the conductive portion 22 of the contact-attached sheet 15. In addition, the above-described contact structure can be made to be small-sized, and a convenient way of replacing the contact-attached sheet can be provided. In addition, since connection under small loads is allowed, it is easy to make contact pressure constant between the electrode portions 10 and 13 and the spiral contactors 18 and 19.

According to an embodiment shown in FIG. 7, the elastic member 16 or 30 shown in FIG. 5 or 6 is not installed between the contact-attached sheet 15 and the fixed member 17, and the fixed member 17 is directly installed on the contact-attached sheet 15. As mentioned above, in a state in which the elastic arms 27 formed on the spiral contactors 18 and 19 are compressed to a height slightly less than one when no force is applied, they are interposed between the fixed member 17 and the flexible printed circuit boards 8 and 11. Accordingly, the elastic arm 27 generates an elastic force in the vertical direction (Z1-Z2 direction) so as to return to its original shape, and the elastic forces of the elastic arms 27, which act in the downward direction in the drawing, are applied to the spiral contactors 18 and 19, respectively. As a result, even though the elastic members 16 and 30 are not installed, the elastic arms 27 of the spiral contactors 18 and 19 are reliably pushed onto the electrode portions 10 and 13 of the flexible printed circuit boards 8 and 11. In addition, the elastic arms 27 and the electrode portions 10 and 13 are securely electrically connected to each other. Accordingly, the electrode portion 10 of the first flexible printed circuit board 8 and the electrode portion 13 of the second flexible printed circuit board 11 are electrically connected to each other by the spiral contactors 18 and 19 and the conductive portion 22 of the contact-attached sheet 15.

However, in order that the contact-attached sheet 15 is securely supported on the flexible printed circuit boards 8 and 11 without being moved due to vibration or impact, and electrical connection between the spiral contactors 18 and 19 and the electrode portions 10 and 13 is improved, it is preferable that the elastic members 16 and 30 be installed between the contact-attached sheet 15 and the fixed member 17. On the other hand, since the elastic members 16 and 30 are not installed in the embodiment shown in FIG. 7, the contact structure can be made to be small-sized (smaller in height). In addition, a convenient way of replacing the contact-attached sheet can be provided. Since connection under small loads is allowed, it is easy to make contact pressure constant between the electrode portions 10 and 13 and the spiral contactors 18 and 19.

According to an embodiment shown in FIG. 8, the fixed member 17 is bent in an arched shape in the lengthwise direction (Y1-Y2 direction). Accordingly, only the center of the fixed member 17 in the lengthwise direction becomes in contact with a top surface of the contact-attached sheet 15. A dotted line shown in FIG. 8 exhibits a state of the fixed member 17 before the mounting portions 17a2 and 17b2 of the fixed member 17 are supported on the mother board 14 by means of the mounting members 20. As shown in FIG. 8, before the fixed member 17 is mounted on the mother board 14, both end parts 17a and 17b of the fixed member 17 are bent greatly in an upward direction (Z1 direction) in the drawing, and the center of the fixed member 17 in the lengthwise direction (Y1-Y2 direction) comes into contact with the contact-attached sheet 15.

The both end parts 17a and 17b of the fixed member 17 shown by a dotted line in FIG. 8 are pressurized in the downward direction (Z2 direction) until the mounting portions 17a2 and 17b2 come in contact with the top surface of the mother board 14. Then, the mounting members 20 are inserted into the through holes 21 formed on the mounting portions 17a2 and 17b2 and the insertion concave portions 14a formed on the mother board 14. Accordingly, the fixed member 17 is fixed on the mother board 14.

Here, the fixed member 17 generates the elastic force in the downward direction in the drawing around the center of the fixed member 17 in contact with the top surface of the contact-attached sheet 15 in the lengthwise direction (Y1-Y2 direction) so as to return to its original shape. In the meantime, the elastic forces are generated in the upward direction in the drawing are generated at the both end parts 17a and 17b of the fixed member 17. Accordingly, the elastic force in the downward direction in the drawing is applied to the contact-attached sheet 15. In addition, in a state in which the elastic arms 27, which are formed on the spiral contactors 18 and 19, are compressed to a height slightly less than one where no force is applied, they are interposed between the fixed member 17 and the flexible printed circuit boards 8 and 11. Accordingly, the elastic arm 27 generates the elastic force in the vertical direction (Z1-Z2 direction) so as to return to its original shape, and the elastic forces of the elastic arms 27, which act in the downward direction in the drawing, are applied to the spiral contactors 18 and 19. As a result, the elastic arms 27 of the spiral contactors 18 and 19 are reliably pushed onto the electrode portions 10 and 13 of the flexible printed circuit boards 8 and 11, and the elastic arms 27 and the electrode portions 10 and 13 are securely electrically connected to each other.

In addition, in FIG. 8, when the mounting portions 17a2 and 17b2 of the fixed member 17 are fixed on the mother board 14, the fixed member 17 is still being bent slightly in the arched shape on the top surface of the contact-attached sheet 15. However, the fixed member 17 may be in contact with an entire surface of the top surface of the contact-attached sheet 15 in the plane shape shown in FIG. 7.

According to an embodiment shown in FIG. 8, the elastic member 16 or 30 shown in FIG. 5 or 6 may be interposed between the fixed member 17 and the contact-attached sheet 15.

In addition, in FIG. 5, the fixed member 17 is securely fixed on the mother board 14 by inserting the mounting member 20 into the through hole 21 and the insertion concave portion 14a. As shown in FIG. 9, the fixed member 17 may be fitted into (fixed to) the mother board 14 by snap coupling using locking portions 17c1 and 17c2, so that it is easier to fix the fixed member 17 into the mother board 14.

According to an embodiment shown in FIG. 10, the shape of contacts with respect to the electrode portions 10 and 13 installed on the contact-attached sheet 15 is different from the shapes in FIGS. 5 to 9. In FIGS. 5 to 9, the contacts are spiral contactors 18 and 19 having the elastic arms 27. However, in FIG. 10, instead of the spiral contactors 18 and 19, a plurality of contacts 42, which linearly extend on the rear surface of the sheet 25 in the widthwise direction (X1-X2 direction), are formed at predetermined intervals in a lengthwise direction (Y1-Y2 direction). Each of the contacts 42 has a metal plate 40, and a film 41. In this case, the film 41 is obtained by forming a conductive pattern on and around the metal plate 40. Alternatively, the contacts 42 may be a multilayer structure having a plurality of metallic thin films therein. The sheet 25 forming the contact-attached sheet 15 is formed of polyimide resin or the like. However, a silicon adhesive may be provided over the entire bottom surface of the sheet 25 and the contacts 42 may be formed under the adhesive.

According to the embodiment shown in FIG. 10, the elastic force in the downward direction (Z2 direction) from the elastic member 16 is applied to the contacts 42 formed on the rear surface of the contact-attached sheet 15, and the contacts 42 are pushed onto the electrode portions 10 and 13 of the flexible printed circuit boards 8 and 11. The bottom surfaces of the contacts 42 are in contact with the top surfaces of the electrode portions 10 and 13. In spite of a few oxidized layers between the contacts and the electrode portions, the contacts 42 and the electrode portions 10 and 13 can be reliably connected to each other due to a tunnel effect.

According to an embodiment shown in FIG. 11, an elastic member 43 is installed only on a top surface of the metal plate 40 that forms each contact 42. The film 41 where the conductive pattern is formed covers the bottom surface and the side surfaces of the metal plate 40 and the top surface and the side surfaces of the elastic member 43. According to the embodiment shown in FIG. 11, each of the contacts 42 includes the metal plate 40, the elastic member 43 and the film 41. The elastic force in the downward direction from the elastic member 43 is applied to the contact 42, and the contacts 42 are pushed onto the electrode portions 10 and 13 of the flexible printed circuit boards 8 and 11. The bottom surface of the contact 42 comes into contact with the top surfaces of the electrode portions 10 and 13. In spite of a few oxidized layers between the contacts and the electrode portions, the contacts 42 and the electrode portions 10 and 13 can be securely electrically connected to each other due to the tunnel effect.

According to the embodiments shown in FIGS. 10 and 11, the contacts 42 and the electrode portions 10 and 13 are electrically connected to each other, and thus the electrode portion 10 of the first flexible printed circuit board 8 is electrically connected to the electrode portion 13 of the second flexible printed circuit board 11 through the contact 42. In addition, in the embodiments shown in FIGS. 10 and 11, size reduction of the contact structure can be ensured, and the contact-attached sheet 15 can be easily replaced with a new contact member. That is, a convenient way of replacing the contact-attached sheet can be provided. In addition, since connection under small loads is allowed, it is easy to make contact pressure constant between the electrode portions 10 and 13 and the contacts 42.

According to an embodiment shown in FIG. 12, the spiral contactors 18 and 19 shown in FIG. 4 are formed of contacts 50 each of which has a mounting portion 51 and an elastic arm 52 shown in FIG. 12. That is, the contacts 50 formed at both sides in the widthwise direction (X1-X2 direction) are connected to each other by the conductive portions 22 (refer to FIG. 4). The elastic arm 52 is elastically transformed in the shape shown in FIG. 12 because of an internal stress. In the contact 50, top and bottom surfaces of the elastic arm 52 are applied with different internal stresses from each other. More specifically, compressive stress is applied to the bottom surface of the elastic arm 52, while tensile stress is applied to the top surface of the elastic arm 52. A sacrificial layer (not shown) is formed between the mounting portion 51 and the sheet 25. The sacrificial layer may be conductive or insulating. For example, the sacrificial layer is formed of a resin layer that contains Ti and conductive filler. The sacrificial layer is not formed at least between the elastic arm 52 and the sheet 25. At first, the elastic arm 52 has a plane shape like the mounting portion 51, but by performing a heat treatment, the elastic arm 52, in which different internal stresses are applied to the upper and bottom surfaces thereof, is bent downwards. In the meantime, the mounting portion 51 is firmly attached to the sheet 25 through the sacrificial layer and not bent by the heat treatment.

The elastic arms 27 of the spiral contactors 18 and 19 shown in FIG. 18 are formed in three dimensions by mechanical processing, as shown in FIG. 18. However, the elastic arm 52 of the contact 50 shown in FIG. 12 can be transformed in three dimensions by itself due to the internal stress the elastic arm 52 has.

According to the embodiment shown in FIG. 12, the elastic member 16 and the fixed member 17 are installed on the contact-attached sheet 15, and the mounting portions 17a2 and 17b2 of the both end parts 17a and 17b of the fixed member 17 in the lengthwise direction are fixed on the mother board 14 by the mounting members 20.

According to the embodiment shown in FIG. 12, the elastic force in the downward direction (Z2 direction) from the elastic member 16 is applied to the contact 50. In addition, the elastic force of the elastic arm 52 itself in the downward direction (Z2 direction) is also applied to the contact 50. As a result, the elastic arms 52 of the contacts 50 are reliably pushed onto the electrode portions 10 and 13 of the flexible printed circuit boards 8 and 11, which leads to a state in which the elastic arms 52 and the electrode portions 10 and 13 are securely electrically connected to each other. Accordingly, the electrode portion 10 of the first flexible printed circuit board 8 and the electrode portion 13 of the second flexible printed circuit board 11 are electrically connected to each other by the contacts 50 and the conductive portions 22 of the contact-attached sheet 15. Also, the contact structure can be made to be small-sized, and a convenient way of replacing the contact-attached sheet can be provided. In addition, since connection under small loads is allowed, it is easy to make contact pressure constant between the electrode portions 10 and 13 and the contacts 50.

By taking advantage of the fact that the elastic arm 52 of the contact 50 is bent by a predetermined heat treatment, thermosetting anisotropic conductive paste 60 is interposed between the flexible printed circuit boards 8 and 11 and the contact-attached sheet 15, as shown in FIG. 13. In FIG. 13, the elastic arm 52 of the contact 50 is not bent, and therefore the contacts 50 and the electrode portions 10 and 13 are not electrically connected to each other. When a heat treatment is performed with respect to the contact 50 and the anisotropic conductive paste 60 from a state shown in FIG. 13, the elastic arm 52 of the contact 50 is bent due to the difference between internal stresses of the top and bottom surfaces. As shown in FIG. 14, the elastic arm 52 is bent downwards (Z2 direction), and the anisotropic conductive paste 60 is subjected to a thermosetting process.

In the inter-member connection structure shown in FIG. 14, the flexible printed circuit boards 8 and 11 and the contact-attached sheet 15 are fixedly adhered to one another, thereby achieving a small-sized inter-member connection structure. In addition, in the case of the inter-member connection structures shown in FIGS. 13 and 14, manufacturing efficiency can be improved because an adhesive is hardened and simultaneously the contacts 50 and the electrode portions 10 and 13 are connected to each other at the same time by performing a heat treatment once.

As shown in FIG. 14, the structure, in which the flexible printed circuit boards and the contact-attached sheet 15 are adhered to one another by an adhesive, can be applied to when the spiral contactor formed in three dimensions by mechanical processing is installed on the contact-attached sheet 15, as shown in FIG. 5. The adhesive is not limited to anisotropy conductive paste, but NCP (Non-Conductive Paste), NCF (Non-Conductive Film) or the like may be used therefor. However, in the case of an adhesive not containing the conductive filler, it is preferable that the adhesive not be installed between the electrode portions 10 and 13 and the contacts 50, which allows to maintain appropriate electrical connection between the contacts 50 and the electrode portions 10 and 13. In addition, when the spiral contactors 18 and 19 shown in FIG. 5 are used, a heat treatment can be performed after predetermined inspection is carried out. That is, if a predetermined result is obtained by the inspection, the heat treatment can be performed so as to harden the adhesive. On the other hand, if a predetermined result is not obtained by the inspection, it is preferable that the inspection be performed again, for example, after the contact-attached sheet 15 is replaced with a new contact-attached sheet 15.

In addition to adhesive fixation, sticky fixation can be performed. Adhesive fixation refers to permanent adhesion and sticky fixation refers to semi-permanent adhesion. In the case of the sticky fixation, the contact-attached sheet 15 can be easily separated from the flexible printed circuit board.

The elastic arm 52 of the contact 50 having internal stresses varied according to the top and bottom surfaces may have a spiral shape, as shown in FIG. 5.

As shown in FIG. 15, the flexible printed circuit boards 8 and 11 are positioned on the mother board 14 as follows. That is, positioning protrusions 70 and 70 are formed on the mother board 14, positioning holes 71 and 71 are formed on the flexible printed circuit boards 8 and 11, and the positioning protrusions 70 are inserted into the positioning holes 71. In this manner, the flexible printed circuit boards 8 and 11 are disposed on predetermined locations on the mother substrate 14. It is preferable that more than two positioning holes 71 and positioning protrusions 70 be formed so as to appropriately position the flexible printed circuit boards 8 and 11 in both widthwise and lengthwise directions.

In addition, in FIG. 16, front ends 8b and 11b of the flexible printed circuit boards 8 and 11 are almost rectangular in shape and wider than other portions thereof. According to appearance of the front ends 8b and 11b of the flexible printed circuit boards 8 and 11, guide portions 80 and 80, which are formed along parts of the side surfaces of the front ends 8b and 11b of the flexible printed circuit boards 8 and 11, are installed at the mother board 14. The guide portions 80 and 80 form a substantially 'L' shape at the corners of both ends of one diagonal line in the front ends 8b and 11b. Accordingly, the front ends 8b and 11b are guided to predetermined positions of the mother board 14 by the guide portions 80 and 80 and are appropriately positioned in both widthwise and lengthwise directions. The shape and position of the guide portion 80 are not limited if the front ends 8b and 11b can be positioned in both widthwise and lengthwise directions.

According to an embodiment shown in FIG. 17, the flexible printed circuit board 8 extending from the hard disc drive 3 is electrically connected to the mother board (the first member) 14. Contacts, such as the spiral contactors 18, are installed on the rear surface of the front end portion of the flexible printed circuit board 8. That is, the front end portion of the flexible printed circuit board 8 functions as the contact-attached sheet shown in FIG. 5. The electrode portion is installed on the top surface of the mother board 14. The inter-member connection structure, for example, using one shown in FIG. 5 is as follows. The flexible printed circuit board 8 is installed on the mother board 14, the elastic member 16 and the fixed member 17 are installed on the flexible printed circuit board 8, and both end parts 17a and 17b of the fixed member 17 are fixed to the mother board 14 through the mounting members 20. In addition, it is possible to use the inter-member connection structures shown in FIGS. 6 to 14.

The embodiments described so far can be used for small electronic apparatuses such as cellular phones as well as a personal computer, such as a notebook computer.

According to the aspect of the invention, the inter-member connection structure includes a first member that has electrode portions formed thereon and a contact member that has contacts formed on a surface of the contact member facing the electrode portions. In this case, the contact and the electrode portion are connected to each other by an elastic force being applied in a first member direction to the contact of the contact member.

According to this configuration, since the contact and the electrode portion can be reliably connected to each other by using the electric force in the first member direction, the connection structure can be more simplified and smaller-sized than that in the related art.

The invention claimed is:

1. An inter-member connection structure comprising:
   a first member that has electrode portions formed thereon;
   a contact member that has contacts formed on a surface of the contact member facing the electrode; and
   a fixed member that is disposed on a surface opposite to the surface of the contact member facing the electrode portions and has both ends supported on the first member or another member different from the first member and the contact member,
   wherein an elastic force is applied to the contacts of the contact member in a first member direction, and the contacts and the electrode portions are connected to each other,
   wherein the fixed member comes into contact with at least a portion of the opposite surface of the surface of the contact member facing the electrode portions and the contacts are pressurized on the electrode portions when the elastic force is received from the fixed member in the first member direction,
   wherein an elastic arm extending in the first member direction is installed in the contact, and the contact is pressurized on the electrode portion by the elastic force of the elastic arm in the first member direction, and
   wherein the elastic arm extends from a base end to a front end in a spiral shape.

2. The inter-member connection structure according to claim 1,
   wherein both ends of the fixed member are fitted into the first member or another member different from the first member and the contact member.

3. The inter-member connection structure according to claim 1,
   wherein an elastic member is installed between the contact member and the fixed member, and
   the contacts are pressurized on the electrode portions when the elastic force is received from the elastic member in the first member direction.

4. An electronic apparatus comprising the inter-member connection structure according to claim 1.

5. The inter-member connection structure according to claim 1,
   wherein the first member and the contact member are adhesively fixed to each other.

6. The inter-member connection structure according to claim 1,
   wherein the first member and the contact member are sticky fixed to each other.

7. The inter-member connection structure according to claim 1,
   wherein the first member and the contact member are fixed together using a semi-permanent adhesion, and
   wherein the contact member and first member are easily separated.

8. The inter-member connection structure according to claim 1, further comprising:
   a second member that has electrode portions formed thereon, wherein the contact member includes first contacts connected to the electrode portions of the first member and second contacts connected to the electrode portions of the second member, and the first contacts and the second contacts are opposite to each other and connected to each other by conductive patterns.

9. The inter-member connection structure according to claim 8, wherein the first member and/or the second member is a flexible printed circuit board.

* * * * *

UNITED STATES PATENT AND TRADEMARK OFFICE
CERTIFICATE OF CORRECTION

PATENT NO. : 7,341,476 B2
APPLICATION NO. : 11/421723
DATED : March 11, 2008
INVENTOR(S) : Kaoru Soeta It is certified that error appears in the above-identified patent and that said Letters Patent is hereby corrected as shown below:

In column 14, in claim 1, line 4, after "facing the" delete "electrode;" and substitute --electrode portions;-- in its place.

Signed and Sealed this

Eleventh Day of November, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,341,476 B2 | Page 1 of 1 |
| APPLICATION NO. | : 11/421723 | |
| DATED | : March 11, 2008 | |
| INVENTOR(S) | : Kaoru Soeta | |

It is certified that error appears in the above-identified patent and that said Letters Patent is hereby corrected as shown below:

In column 14, in claim 1, line 14, after "facing the" delete "electrode;" and substitute --electrode portions;-- in its place.

This certificate supersedes the Certificate of Correction issued November 11, 2008.

Signed and Sealed this

Ninth Day of December, 2008

JON W. DUDAS
*Director of the United States Patent and Trademark Office*